US008510231B2

(12) United States Patent
Tokarski et al.

(10) Patent No.: US 8,510,231 B2
(45) Date of Patent: Aug. 13, 2013

(54) METHOD AND SYSTEM FOR PRINTING MULTIPLE REGIONS ACROSS A MAIL PIECE

(75) Inventors: Joseph P. Tokarski, Prospect, CT (US); John A. Hurd, Lake Mary, FL (US); Gary S. Jacobson, Norwalk, CT (US); Wesley A. Kirschner, Farmington, CT (US); Robert G. Arsenault, Stratford, CT (US)

(73) Assignee: Pitney Bowes Inc., Stamford, CT (US)

( * ) Notice: Subject to any disclaimer, the term of this patent is extended or adjusted under 35 U.S.C. 154(b) by 1885 days.

(21) Appl. No.: 11/083,462

(22) Filed: Mar. 17, 2005

(65) Prior Publication Data

US 2006/0212410 A1 Sep. 21, 2006

(51) Int. Cl.

| | |
|---|---|
| ***G06Q 30/00*** | (2012.01) |
| ***G01R 11/56*** | (2006.01) |
| ***G01R 21/133*** | (2006.01) |
| ***G06F 17/00*** | (2006.01) |

(52) U.S. Cl.

USPC .......................................... 705/330; 705/412

(58) Field of Classification Search

USPC .......................................... 705/401, 408, 330

See application file for complete search history.

(56) References Cited

U.S. PATENT DOCUMENTS

| | | | | |
|---|---|---|---|---|
| 4,591,281 | A * | 5/1986 | Howard et al. | 347/104 |
| 2003/0016986 | A1* | 1/2003 | Manduley | 400/611 |

* cited by examiner

*Primary Examiner* — John Hayes
*Assistant Examiner* — Allen J Jung
(74) *Attorney, Agent, or Firm* — Brian A. Lemm; Charles R. Malandra, Jr.; Steven J. Shapiro

(57) ABSTRACT

A method and system that allows for large amounts of data to be printed utilizing a small memory is provided. The complete image to be printed on the print medium is separated into different regions each having associated print data. The memory device, while being too small to store all of the print data for the full image, is capable of storing the print data associated with each region. The print data for each region is released from the print head controller to the memory device for printing in a timed fashion based on movement of the print medium. The print data for a subsequent region will not be passed to the memory until the print medium has moved a sufficient distance, thereby indicating that printing of the preceding region has been completed.

9 Claims, 3 Drawing Sheets

METHOD AND SYSTEM FOR PRINTING MULTIPLE REGIONS ACROSS A MAIL PIECE

FIELD OF THE INVENTION

The invention disclosed herein relates generally to mailing machines, and more particularly to a method and system for printing multiple regions across a mail piece.

BACKGROUND OF THE INVENTION

Mailing machines for printing postage indicia on envelopes and other forms of mail pieces have long been well known and have enjoyed considerable commercial success. There are many different types of mailing machines, ranging from relatively small units that handle only one mail piece at a time, to large, multi-functional units that can process hundreds of mail pieces per hour in a continuous stream operation. The larger mailing machines often include different modules that automate the processes of producing mail pieces, each of which performs a different task on the mail piece. The mail piece is conveyed downstream utilizing a transport mechanism, such as rollers or a belt, to each of the modules. Such modules could include, for example, a singulating module, i.e., separating a stack of mail pieces such that the mail pieces are conveyed one at a time along the transport path, a moistening/sealing module, i.e., wetting and closing the glued flap of an envelope, a weighing module, and a metering module, i.e., applying evidence of postage to the mail piece. The exact configuration of the mailing machine is, of course, particular to the needs of the user.

Typically, a control device, such as, for example, a microprocessor, performs user interface and controller functions for the mailing machine. Specifically, the control device provides all user interfaces, executes control of the mailing machine and print operations, calculates postage for debit based upon rate tables, provides the conduit for the Postal Security Device (PSD) to transfer postage indicia to the printer, operates with peripherals for accounting, printing and weighing, and conducts communications with a data center for postage funds refill, software download, rates download, and market-oriented data capture. The control device, in conjunction with an embedded PSD, is utilized to generate an indicium that evidences payment of postage for a mail piece. The generated indicium is printed on the mail piece for which it was generated. Typically, the content, size and location of an indicium is specified by the postal authority, and any indicium generated and printed by the mailing machine must conform to the applicable specifications promulgated by the postal authority.

FIG. 1 illustrates an example of an indicium 10 that can be generated by a mailing machine. The indicium 10 consists of a two-dimensional (2D) barcode 12 and certain human-readable information 14. Some of the data included in the barcode 12 can include, for example, the PSD manufacturer identification, PSD model identification, PSD serial number, values for the ascending and descending registers of the PSD, postage amount, and date of mailing. In addition, a digital signature is required to be created by the PSD for each mail piece and placed in the digital signature field of the barcode. The indicium 10 also includes a region 16 in which a slogan, advertisement or the like may or may not be printed. Typically, the indicium 10 will measure 5.5 inches long by 1.0 inches wide.

One factor that greatly influences the success of a mailing machine is cost. It is desirable to keep the cost of mailing machines as low as possible. To reduce cost, components are carefully sized and selected such that all typical necessary functions can be performed by the mailing machine. This can lead to problems, however, if changes to the functionality of the mailing machine are desired and one or more components used in the mailing machine are incapable of supporting the new functionality. For example, the processing performed by the mailing machine, including generating the indicium image and printing the image, requires a storage medium, such as, for example, a memory device, to store data. When the control unit generates an indicium 10 as illustrated in FIG. 1, the data is passed to a print head controller that generates the image as illustrated in FIG. 1 based on the data. The image is then stored in a memory device, such as, for example, a random access memory (RAM), where it is subsequently read and printed by the print driver hardware associated with the print head. To keep costs at a minimum, the RAM used to store the image is appropriately sized to be as small as possible but still able to accommodate the indicium image. Problems will arise, however, if the size of the indicium image is increased due, for example, to new or different postal requirements, or if additional information, such as, for example, additional slogans or advertisements, special services, or a return address are included in the indicium image to be printed on a mail piece. For example, FIG. 2 illustrates a mail piece 20 that includes an indicium 10 as illustrated in FIG. 1. The mail piece 20 also includes an area 22 for Recipient Information that can include, for example, the name and address to which the mail piece is to be delivered. The mail piece 20 also includes an area 24 in which additional information, such as described above for example, can be printed, and an area 26 in which Sender Information that can include, for example, the name and address of the sender of the mail piece 20 can be included.

When processing the mail piece 20, it is desirable to print all of the desired information on the mail piece 20 in a single pass of the mail piece 20 through the mailing machine. As such, two print heads are typically required, one positioned to print the information located near the top of the mail piece 20, e.g., indicium 10 and areas 24, 26, and a second print head to print the area 22. If, however, the additional data required for the additional information and sender information are included in the data sent to the print head controller by the control unit and the print head controller generates a complete image, including the indicium 10, additional information and/or sender information, the size of the indicium image will be increased to a point where the RAM is too small to accommodate the entire image. This will result in a situation known as a print under-run, whereby the printer will declare that it does not have enough memory to render the image and the image will not be printed or only a portion of the image will be printed. Of course, this problem could be solved by increasing the size of the RAM to accommodate the data required for the larger image, but this solution will add to the cost of the mailing machine, thereby making it undesirable.

Thus, there exists a need for a method and system that allows for large amounts of data to be printed utilizing a small memory device that does not have sufficient capacity to simultaneously store all of the data desired to be printed.

SUMMARY OF THE INVENTION

The present invention alleviates the problems associated with the prior art and provides a method and system that allows for large amounts of data to be printed utilizing a small memory device that does not have sufficient capacity to simultaneously store all of the data desired to be printed.

In accordance with the present invention, the complete image to be printed on the mail piece, including the indicium, additional information, and sender information, is separated into different regions each having associated print data. The memory device, while being too small to store all of the print data for the full image, is capable of storing the print data associated with each region. The print data for each region is released from the print head controller to the memory device for printing in a timed fashion based on movement of the mail piece as processing of the mail piece is occurring. Thus, the print data for the first region is passed to the memory where it is read and printed on the mail piece. The print data for the next region will not be passed to the memory until a signal is received indicating the mail piece has moved a predetermined distance and the first region has passed the print head, thereby indicating that the first region has been printed. The print data for the next region can then be passed to the memory for printing. The print data for a subsequent region will not be passed to the memory until the mail piece has moved a sufficient distance, thereby indicating that printing of the preceding region has been completed. Optionally, one or more regions need not have any printing therein. Thus, a small memory device can be utilized to render an image of any length, without a print under-run ever occurring.

Therefore, it should now be apparent that the invention substantially achieves all the above aspects and advantages. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

DESCRIPTION OF THE DRAWINGS

The accompanying drawings illustrate a presently preferred embodiment of the invention, and together with the general description given above and the detailed description given below, serve to explain the principles of the invention. As shown throughout the drawings, like reference numerals designate like or corresponding parts.

DETAILED DESCRIPTION OF THE PRESENT INVENTION

Figure 1:
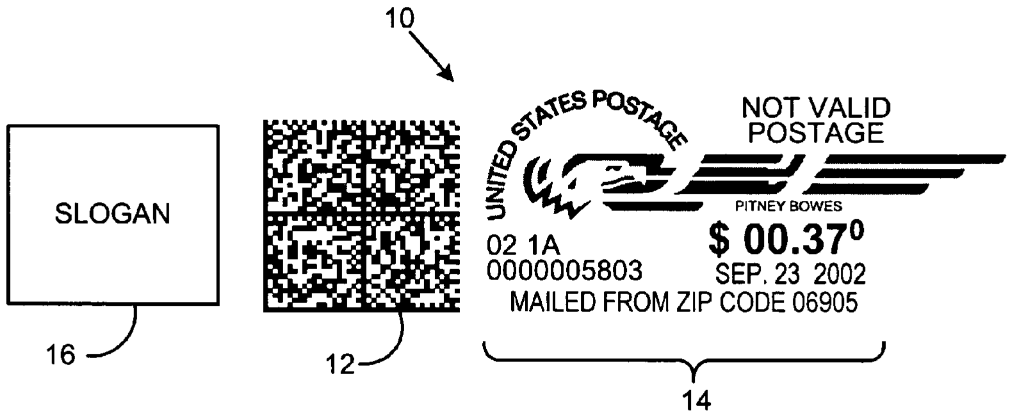
FIG. 1 illustrates an example of an indicium used to evidence payment of postage.
Figure 3:
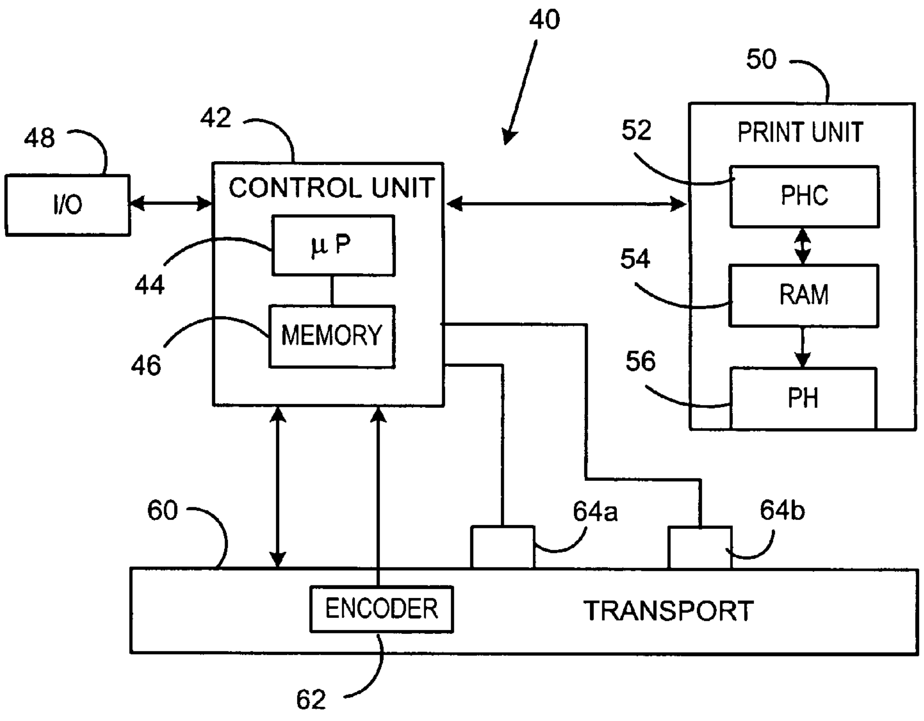
FIG. 3 illustrates in block diagram form a portion of a mail processing system that performs the timed release of print data according to an embodiment of the present invention.

In describing the present invention, reference is made to the drawings, wherein there is seen in FIG. 3 a block diagram of a portion of a mail processing system 40, such as a mailing machine, in which embodiments of the present invention can be utilized. It should be noted that while the following description is being made with respect to a mail processing system, the present invention is not so limited and can be utilized in any type of system that requires large amounts of data to be printed utilizing a small memory device. Mail processing system 40 includes a control unit 42, that preferably includes one or more controller units, such as, for example, a microprocessor 44, general or special purpose processor or the like, to control operation of the mail processing system 40. A memory 46 is coupled to the microprocessor 44 for storage of software executable by microprocessor 44, e.g., processing instructions utilized by microprocessor 44, and data generated during operation of mail processing system 40. Memory 46 may be, for example, random access memory (RAM), read only memory (ROM) or a combination of the two. Control unit 42 is coupled to one or more input/output devices 48, such as, for example, a keyboard and/or display unit for the input and output of various data and information. A print unit 50 is also coupled to the control unit 42. Print unit 50 includes a print head controller (PHC) 52, a memory device 54, such as a RAM, and a print head (PH) 56. RAM 54 is limited in size such that an indicium image, such as the indicium 10 illustrated in FIG. 1, could be stored in the memory 54, but any image larger than the indicium 10 would not fit in the memory 54. Print head 56 is preferably an ink-jet printer adapted to print images generated by the control unit 42 on mail pieces, and is coupled to and generally controlled by the print head controller 52. Print head controller 52 receives print data from the control unit 42, and generates an image based on the print data. The image generated by the print head controller 52 is stored in the memory 54, which is then read by the print driver hardware associated with the print head 56 for printing.

A transport 60, including, for example, rollers and/or belts, is utilized to transport mail pieces through the mail processing system 40 based on signals provided from the control unit 42. The transport 60 will transport the mail pieces past the print head 56 such that printing can occur on each mail piece. Location of the mail piece within the mail processing system 40 is monitored utilizing one or more sensors 64*a*, 64*b* located along the transport 60. Sensors 64*a*, 64*b* could be, for example, optical sensors as are known in the art. Additionally, the control unit 42 is in operative communication with an encoder 62. Encoder 62 is included as part of the transport 60, and sends signals to the control unit 42, indicating movement of the transport 60, and thus mail pieces, based on changes of state of the encoder 62. One example of an encoder 62 includes an encoder disk that has a plurality of apertures located around its circumference, a light source and a light detector. As the transport 60 conveys mail pieces along the mailing processing system 40, it causes the encoder disk to rotate. The encoder disk, the light source and the encoder detector are positioned with respect to one another so that the encoder disk causes the light source to be alternately blocked and unblocked as the encoder disk rotates. The transition from blocked to unblocked or vice versa provides a synchronization signal. The signals from encoder 62 are used to control firing pulses for print head 56, thereby ensuring that the images generated by the print head controller 52 are printed in the proper location on a mail piece.

Figure 4:
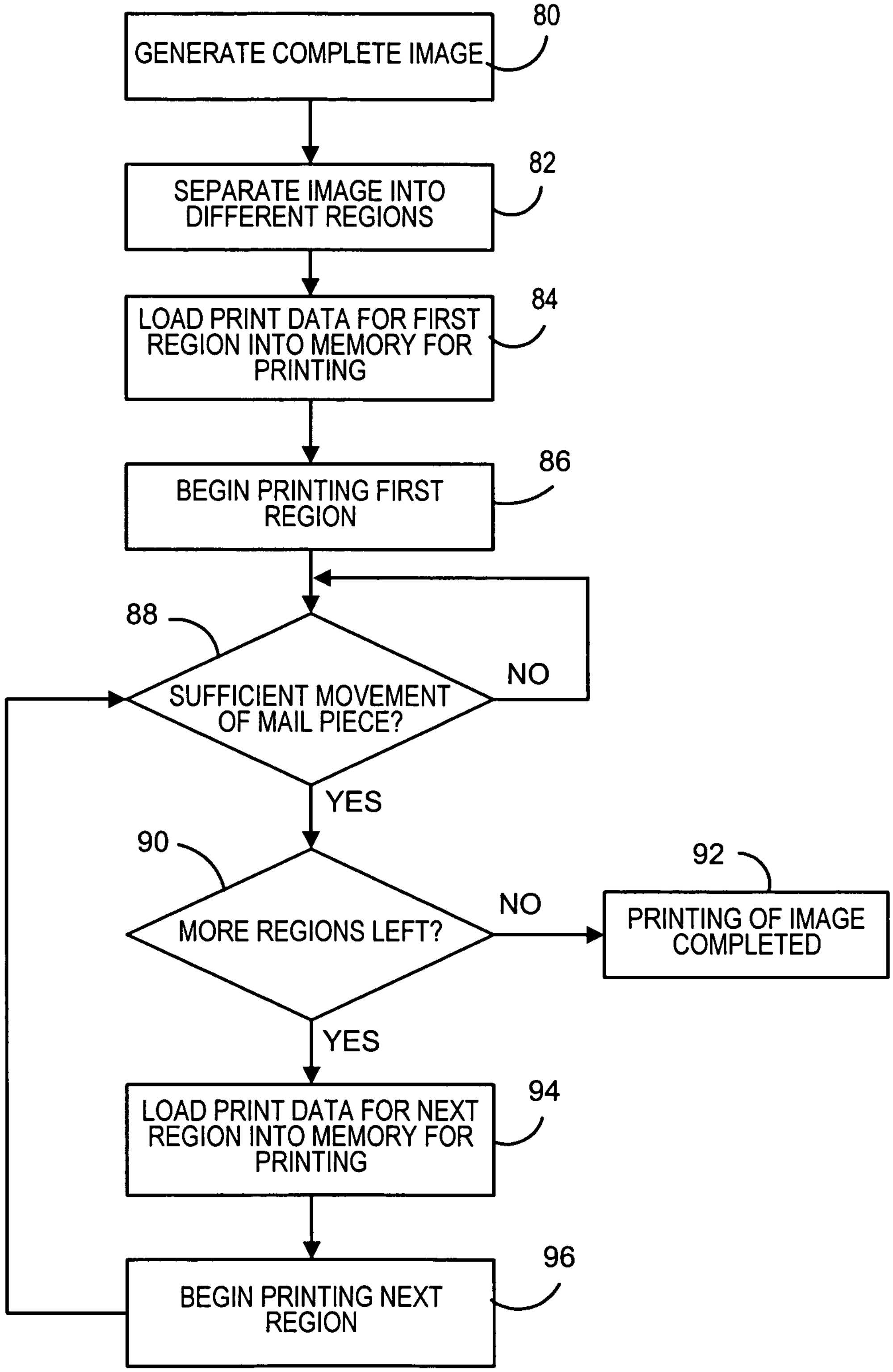
FIG. 4 illustrates in flow chart form an example of the processing performed by the mail processing system of FIG. 3 according to an embodiment of the present invention.

FIG. 4 illustrates in flow chart form an example of the processing performed by the mail processing system 40 of FIG. 3 according to an embodiment of the present invention for each mail piece processed by the mail processing system 40. In step 80, the complete image to be printed on the current mail piece is generated from print data generated by the control unit 42. The complete image would include, for example, the indicium such as indicium 10, sender information and optionally other additional information as previously described. The generation of the image could be triggered, for example, by the mail piece passing a sensor, e.g., sensor 64*a*, along the transport path. It should be understood that generating the image includes performing the accounting functions to account for the postage value as is done in mail processing systems. The image generation could be performed by the microprocessor 44, the print head controller 52, or a combination of the two. In step 82, the complete image is separated into different regions, with each region being small enough such that all of the print data for the region can be stored in the memory 54. The separation can be performed by either the control unit 44 or the print head controller 52. In step 84, the print data for the first region is loaded from the print head controller 52 to the memory 54 for printing. Typically, since the indicium is required to be printed in the upper right hand corner of the face of the mail piece, it will be printed first as the mail piece is processed and therefore will generally constitute the first region. In step 86, printing of the first region begins by the print head 56 reading the print data for the first region from the memory 54 and printing an image corresponding to the read print data. Such printing can be triggered, for example, by the mail piece passing a sensor, e.g., sensor 64*b*, along the transport path along with signals from the encoder 62.

Utilizing the encoder 62 to determine movement of the transport 60, the control unit 42 can identify the exact location of the mail piece along the transport path, and therefore knows exactly how far the mail piece has traveled. In addition, the control unit 42 will also know exactly how much space on the mail piece each region of the complete image will occupy. Using this information, in step 88, the control unit 42 (and/or print head controller 52) will determine if there has been sufficient movement of the mail piece such that printing of the first region is completed. If the area occupied by the first region on the mail piece has not moved past the print head 56, monitoring will continue. Once it has been determined that there has been sufficient movement of the mail piece such that printing of the print data for the first region has been completed, then in step 90 it is determined if there are more regions left in the entire image that have not been printed. If in step 90 it is determined that there are no more regions left, then in step 92 the printing of the entire image is completed across the face of the mail piece, and the processing for the current mail piece stops.

Figure 2:
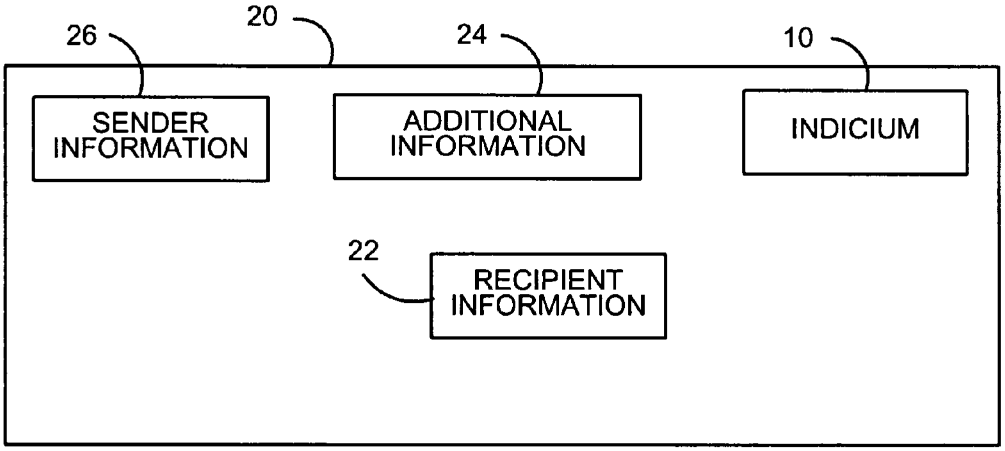
FIG. 2 illustrates a mail piece having multiple print areas thereon.

If in step 90 it is determined that there are more regions left to be printed, then in step 94 the print data for the next region is loaded into the memory 54 for printing. Thus, the release of the next region for printing is performed in a timed fashion based on the movement of the mail piece. In step 96, printing of the next region begins by the print head 56 reading the print data for the next region from the memory 54. The timing of the printing for the next region would preferably be controlled based on signals from the encoder 62, thereby ensuring that the printing of the image occurs in the proper location. Optionally, if it is desired to provide a gap between the different regions of the image where no printing is performed, a delay of the printing for the next region can be implemented by the print head controller 52. Thus, for example, if the entire image consists of only an indicium image 10 and a return address, and it is desired to print the return address in the upper left hand corner of the mail piece, the printing of the return address must be delayed after the indicium image has been printed such that it will be printed near the trailing edge of the mail piece. To ensure proper positioning of the return address, the size of the mail piece must be known, and can be determined based on the leading and trailing edges passing a sensor, such as, for example, sensor 64*a*, located along the transport path of the mail piece. The printing of the next region, e.g., return address, can then be delayed for a sufficient predetermined period of time, based on the length of the mail piece, such that it will be printed in the desired location on the mail piece, e.g., area 26 as illustrated in FIG. 2.

After printing of the next region has begun in step 96, the processing returns to step 88 to determine if there has been sufficient movement of the mail piece such that printing of the next region is completed. If the area occupied by the next region on the mail piece has not moved past the print head 56, monitoring will continue. Once it has been determined that there has been sufficient movement of the mail piece such that printing of the print data for the next region has been completed, then in step 90 it is determined if there are more regions left in the entire image that have not been printed. If in step 90 it is determined that there are no more regions left, then in step 92 the printing of the entire image is completed across the face of the mail piece, and the processing for the current mail piece stops. If in step 90 it is determined that there are more regions left to be printed, then in step 94 the print data for the next region is loaded into the memory 54 for printing, and the processing continues to loop until there are no more regions left to be printed on the mail piece. Optionally, a region can be provided on some mail pieces and not on others. For example, a mailer may desire to include an indicium and a return address on every mail piece being processed by the mail processing system 40, but may desire to include additional information, e.g., advertising slogans or messages, on only certain mail pieces based, for example, on the recipient information for targeted advertising or the like. Thus, although the complete image may be separated into three regions, e.g., indicium, additional information, sender information, the printing of each region will not be activated for all of the mail pieces. Such activation/deactivation can be controlled, for example, through software controls that determines at least a portion of the recipient address, e.g., zip code, and compares it to a list of zip codes for which all print regions should be activated. Alternatively, the activation/deactivation could be controlled, for example, by a scanner (not shown) coupled to the control unit 42 that scans a barcode or the like applied to each mail piece to determine if all of the print regions should be activated.

Thus, according to the present invention, a small memory can be used to print an image of any length on a medium, without the possibility of a print under-run ever occurring. By timing the release of the image through the memory based on movement of the print medium, an image of any length can be printed on the print medium or across a plurality of print mediums.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description.

What is claimed is:

1. A method for printing a complete single image including a postage indicium and other information not related to the postage indicium on a mail piece in a mail processing system including a printer, the printer retrieving print data associated with the complete single image from a memory device, the complete single image having an amount of print data greater than capacity of the memory device, the method comprising:

separating, by a processor, the complete single image into a first region including all of the postage indicium and a second region including at least a portion of the other information, each region being sized such that all print data associated with each region can be stored in the memory device;

transporting the mail piece along a transport path through the mail processing system, the transport path passing the mail piece past a print head;

loading all print data associated with the first region into the memory device as the mail piece approaches the print head;

reading the print data associated with the first region from the memory device and printing an image of the postage indicium corresponding to the print data associated with the first region onto the mail piece as the mail piece is transported past the print head;

determining, by the processor, if printing of the first region has been completed based on movement of the mail piece along the transport;

loading all print data associated with the second region into the memory device after it has been determined that printing of the first region has been completed based on movement of the mail piece along the transport path; and reading the print data associated with the second region from the memory device and printing an image of the other information corresponding to the print data for the second region onto the mail piece as the mail piece is transported past the print head.

2. The method of claim 1, wherein printing an image corresponding to the print data for the second region further comprises:

printing the image corresponding to the print data for the second region after a predetermined delay, wherein a gap will be provided between the postage indicium and the other information.

3. The method of claim 1, wherein determining if printing of the first region has been completed further comprises:

utilizing an encoder to determine movement of the mail piece along the transport path.

4. The method of claim 1, wherein the other information includes a return address for the mail piece.

5. The method of claim 1, wherein the other information includes an advertisement or slogan.

6. The method of claim 1, wherein the mail processing system processes a plurality of mail pieces, and the second region is printed on only a portion of the plurality of mail pieces.

7. A mail processing system comprising:

a control unit for generating print data for a complete single image including a postage indicium and other information not related to the postage indicium to be printed on a mail piece;

a transport to transport mail pieces through the system for processing;

a memory device coupled to the control unit to store the print data for the single image, the memory device having insufficient capacity to store all of the print data associated with the complete single image; and a print head coupled to the memory device for reading the print data from the memory device and printing the complete single image on a mail piece;

the control unit and print head being programmed to:

separate the complete single image into a first region including all of the postage indicium and a second region including at least a portion of the other information, each region being sized such that all print data associated with each region can be stored in the memory device;

load all print data associated with the first region into the memory device as the mail piece approaches the print head;

read the print data associated with the first region from the memory device and print an image of the postage indicium corresponding to the print data associated with the first region onto the mail piece as the mail piece is transported past the print head;

determine if printing of the first region has been completed based on movement of the mail piece by the transport;

load all print data associated with the second region into the memory device after it has been determined that printing of the first region has been completed based on movement of the mail piece by the transport; and read the print data associated with the second region from the memory device and print an image of the other information corresponding to the print data for the second region onto the mail piece as the mail piece is transported past the print head.

8. The system of claim 7, wherein the other information includes a return address for the mail piece.

9. The system of claim 7, wherein the other information includes an advertisement or slogan.

* * * * *